United States Patent
Cranford, Jr. et al.

(10) Patent No.: US 7,149,269 B2
(45) Date of Patent: Dec. 12, 2006

(54) RECEIVER FOR CLOCK AND DATA RECOVERY AND METHOD FOR CALIBRATING SAMPLING PHASES IN A RECEIVER FOR CLOCK AND DATA RECOVERY

(75) Inventors: Hayden C. Cranford, Jr., Apex, NC (US); Vernon R. Norman, Cary, NC (US); Martin Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 748 days.

(21) Appl. No.: 10/375,286

(22) Filed: Feb. 27, 2003

(65) Prior Publication Data
US 2004/0170244 A1 Sep. 2, 2004

(51) Int. Cl.
*H03D 3/24* (2006.01)
(52) U.S. Cl. ............... 375/373; 375/371; 375/354; 327/1; 709/248; 714/12
(58) Field of Classification Search ................ 375/373, 375/371, 354; 327/1; 709/248; 714/12
See application file for complete search history.

(56) References Cited
U.S. PATENT DOCUMENTS

| | | | |
|---|---|---|---|
| 3,608,660 A | 9/1971 | Smith | |
| 4,018,190 A | 4/1977 | Henault | |
| 4,040,566 A | 8/1977 | Chiarelli | |
| 4,164,149 A | 8/1979 | Okubo | |
| 5,020,078 A * | 5/1991 | Crespo | ............... 375/233 |
| 5,137,353 A | 8/1992 | Seegmiller | |
| 5,216,391 A * | 6/1993 | Shiraishi et al. | ............. 332/101 |
| 5,576,065 A | 11/1996 | Gaveske | |
| 6,107,691 A | 8/2000 | Gore et al. | |
| 6,295,327 B1 * | 9/2001 | Takla | .................. 375/375 |
| 6,366,225 B1 * | 4/2002 | Ozdemir | .................. 341/111 |
| 6,704,355 B1 * | 3/2004 | Lai | ..................... 375/231 |
| 7,016,449 B1 * | 3/2006 | Buchwald et al. | .......... 375/373 |
| 2002/0064425 A1 | 5/2002 | Stanton | |
| 2002/0131539 A1 * | 9/2002 | Li et al. | .................... 375/355 |
| 2003/0123594 A1 * | 7/2003 | Glenn et al. | ................ 375/373 |

FOREIGN PATENT DOCUMENTS

| | | |
|---|---|---|
| DE | 197 55 145 A | 1/1999 |
| EP | 1 405 966 A1 | 4/2004 |
| WO | WO 00 34178 A | 6/2000 |

* cited by examiner

*Primary Examiner*—Mohammed Ghayour
*Assistant Examiner*—Erin M. File
(74) *Attorney, Agent, or Firm*—Joscelyn G. Cockburn

(57) ABSTRACT

A receiver for clock and data recovery includes n sampling latches (SL1 . . . SLn) for determining n sample values (SV1 . . . SVn) of a reference signal (Ref2) at n sampling phases ($\phi$1a . . . ($\phi$na) having sampling latch inputs and sampling latch outputs. The receiver further includes a phase position analyzer (5) connected to the sampling latch outputs for generating an adjusting signal (AS) for adjusting the sampling phase ($\phi$1a . . . $\phi$na), if the sample value (SV1 . . . SVn) deviates from a set point and a phase interpolator (9) for generating sampling phases ($\phi$1u . . . $\phi$nu). A sampling phase adjusting unit (6) connected with its inputs to the phase position analyzer (5) and the phase interpolator (9) and with its outputs to the sampling latches (SL1 . . . SLn) is provided for generating adjusted sampling phases ($\phi$1a . . . $\phi$na) depending on the sampling phases ($\phi$1u . . . $\phi$nu) and said adjusting signal (AS).

16 Claims, 7 Drawing Sheets

RECEIVER FOR CLOCK AND DATA RECOVERY AND METHOD FOR CALIBRATING SAMPLING PHASES IN A RECEIVER FOR CLOCK AND DATA RECOVERY

TECHNICAL FIELD

The present invention relates to a receiver for clock and data recovery and a method for calibrating sampling phases in a receiver for data and phase recovery.

A clock and data recovery (CDR) receiver can be used for high-speed serial links. A simplified block diagram of a high-speed serial link is shown in FIG. 1. If data, which exit as n-bit wide data words DP, should be transferred over a channel C, e.g. a cable or an optical fiber, in which the data can be transferred only serial, the n-bit wide parallel data DP have to be converted at first into a serial data stream DS. This is carried out by a multiplexer M, which switches sequentially the n-bit data lines at its multiplexer inputs M.1, M.2, M.3 to M.n to its output M.10, in fact in dependence to a clock signal TXCLK. After the data DP have been transmitted as serial data stream DS over the channel C they have to be recovered out of the data stream DS. Therefore a clock and data recovery unit R is provided, which is connected with its input R.1 to the channel C and which puts the recovered clock RCLK on its clock output R.3 and the recovered data RDATA on its data output R.2. At the data output R.2 of the clock and data recovery unit R the recovered data RDATA are still present in serial form. To convert the recovered data RDATA back into parallel data the data output R.2 of the clock and data recovery unit R is connected to a data input D.10 of a demultiplexer D, which switches the data input D.10 sequentially to the n data outputs D.1, D.2, D.3 to D.n. At the output terminal D.30 the data clock DCLK is available.

BACKGROUND OF THE INVENTION

The higher the data transfer rate in the channel C is, the sooner the timing accuracy during any decision-making process gets a key issue in the design of high-speed serial links. Such decisions have to be made at several points in the system, for example when launching a bit at the transmitter, when determining the bit value of an incoming symbol at the receiver, and when measuring the position of the bit edge at the receiver to determine if the bit is early or late. Any inaccuracy or noise in the timing of those decisions is directly degrading the jitter budget of the link and therefore severely complicating the design.

The invention relates to the calibration of the relative timing positions of sampling phases. High accuracy of the sampling clocks is a key requirement in the design of high-speed serial links above 4 GBit/s in high performance CMOS (complementary metal oxide semiconductor) processes. If there is any offset in the position of the individual sampling edges, timing jitter is added to the system. At 100 ps to 200 ps cycle time, a few picoseconds are already making the difference between an acceptable and an unacceptable bit error rate (BER).

One reason for an offset which leads to inaccuracy in the sampling phase lies in the manufacturing process. The gate thickness for deep-sub-micron CMOS technologies measures only a couple of atoms. The threshold voltage of a CMOS device is a function of the gate thickness. Due to the fact that the number of atomic layers that form the gate oxide is very difficult to control, threshold voltage shifts have to be expected, which in turn lead to aforementioned inaccuracies.

One possibility to reduce the inaccuracy is to increase the power. Another possibility consists in there that the circuit layout with regard to the clock distribution is done very carefully. But both solutions are not always desirable and have obviously disadvantages.

SUMMARY OF THE INVENTION

An object of the present invention is to provide a receiver for clock and data recovery and a method for calibrating sampling phases in a receiver for data and phase recovery that allows to reach high accuracy in the sampling phase position without the associated high power.

Advantageously, also defect sampling latches can be detected with the invention.

According to one aspect of the invention, this object is achieved by a receiver for clock and data recovery with the features of the independent claim 1, and by a method for calibrating sampling phases in a receiver for clock and data recovery with the features of the independent claim 14.

The receiver for clock and data recovery according to the invention comprises n sampling latches for determining n sample values of a reference signal at n sampling phases having sampling latch inputs and sampling latch outputs. The receiver further comprises a phase position analyzer connected to the sampling latch outputs for generating an adjusting signal for adjusting the sampling phase, if the sample value deviates from a set point and a phase interpolator for generating sampling phases. A sampling phase adjusting unit connected with its adjusting inputs to the phase position analyzer and the phase interpolator and with its outputs to the sampling latches is provided for generating adjusted sampling phases depending on the sampling phases and the adjusting signal.

The method for calibrating sampling phases in a receiver for clock and data recovery according to the invention comprises the following steps:

First a reference signal is led to n sampling latches.

Then the reference signal is sampled at different sampling phases and the corresponding sample values are determined with the sampling latches.

At least, if the sample value deviates from a set point the corresponding sampling phase is corrected.

Advantageous further developments of the invention arise from the characteristics indicated in the dependent patent claims Preferably the phase position analyzer in the receiver according to the invention comprises means for determining average values of the sample values. Average values can easily be calculated and make it easier to determine the appropriate adjusting signal.

The phase position analyzer of the receiver typically comprises means for increasing the adjusting signal, if the average value is lower than a set point, and for decreasing the adjusting signal, if the average value is higher than the set point.

In an embodiment of the receiver according to the invention the set point amounts 0,5 if the sample phase should be synchronized with an edge of the reference signal.

In an another embodiment of the receiver according to the invention the sampling phase adjusting unit comprises a buffer or inverter with a programmable delay time. With that the sample phase generated by the phase interpolator can be easily corrected if necessary.

In an alternative embodiment to the aforementioned the sampling phase adjusting unit of the receiver according to the invention comprises a phase interpolating device for interpolating two consecutive sample phases.

In a further embodiment the interpolating device comprises first and second means for weighting the two sample phases.

In a third alternative embodiment to the aforementioned the sampling phase adjusting unit of the receiver according to the invention comprises a phase interpolating device for interpolating three sample phases, wherein one of these is a nominal sampling phase superimposed by the two other phases.

Furthermore the receiver can comprise a data input for receiving serial data, which shall be recovered, and switching means connected to the sampling latch inputs, wherein the switching means are provided for leading the serial data signal or the reference signal to the sampling latch inputs.

In a typical application the receiver according to the invention comprises a sample memory for storing the sampled values. The sample memory is connected between the sample latches and the phase position analyzer.

In a further embodiment the reference signal in the receiver has a constant phase and a constant frequency.

In a still further embodiment the receiver according to the invention comprises a phase locked loop for generating the reference signal.

In another embodiment, the receiver comprises a data output for delivering parallel data connected to the sample memory. The receiver further comprises an edge detection unit for detecting edges in the serial data signal, which is connected between the sample memory and a control input of the phase interpolator.

In another aspect of the method according to the invention the receiver is switched in calibration mode and the reference signal is led to the sampling latches.

In a typical application the method according to the invention the receiver is switched in recovery mode after the calibration is finished. With that it can be ensured that the recovery of the data taking place after the calibration can be carried out with an optimized bit error rate.

In an embodiment of the method according to the invention the determination of the sample values comprises the following steps:
a) The reference signal is sampled s times at a first sample phase position, wherein the sample value of the reference signal is determined each time with the first sample latch.
b) From the s sample values an average value is calculated.
c) These steps are repeated at n sampling phases, wherein at the nth sampling phase each sample value is determined with the nth sample latch.

In an another embodiment of the method according to the invention the correction of the sampling phase comprises the following step. The sampling phase is increased if the average value is lower than 0.5. The advantage of this rule is that it can be easily implemented and evaluated.

It is also possible that the correction of the sampling phase in the method according to the invention comprises the following step. The sampling phase is decreased if the average value is higher than 0.5. The advantage of this rule is that it can be easily implemented and evaluated.

At least, the method according to the invention comprises the following steps:
The sampling phases are shifted by a predetermined value.
The reference signal is sampled at said shifted sampling phases and the corresponding sample values are determined with said sampling latches.
If the sample value deviates from the set point, the corresponding sampling phase is corrected.
These steps are repeated as often as it is necessary for synchronizing all sampling phases with the reference signal.

With this advantageously all sampling phases can be corrected.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

DETAILED DESCRIPTION OF THE INVENTION

Figure 1:
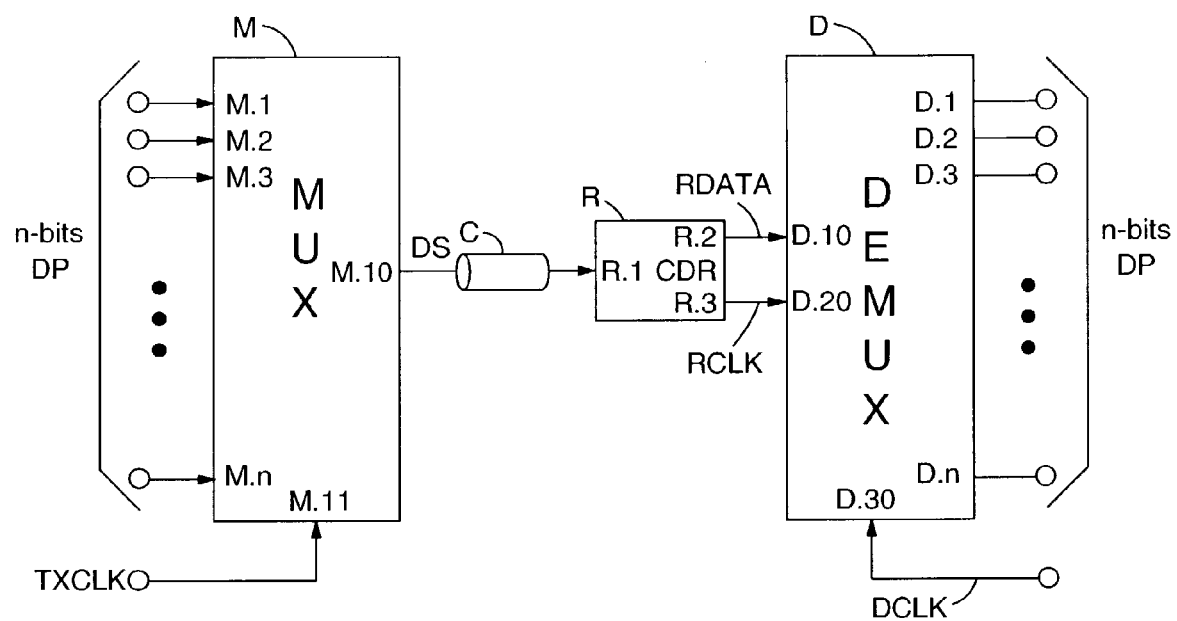
FIG. 1 shows a block diagram of a serial link.

FIG. 1 shows, as already described above, a block diagram of a serial link. The invention concerns the realization of the clock and data recovery receiver comprising the clock and data recovery unit R and the demultiplexer D.

Before the data stream DS, also called serial data signal, is received and recovered by the clock and data recovery unit R the receiver is switched in a calibration mode.

Figure 2:
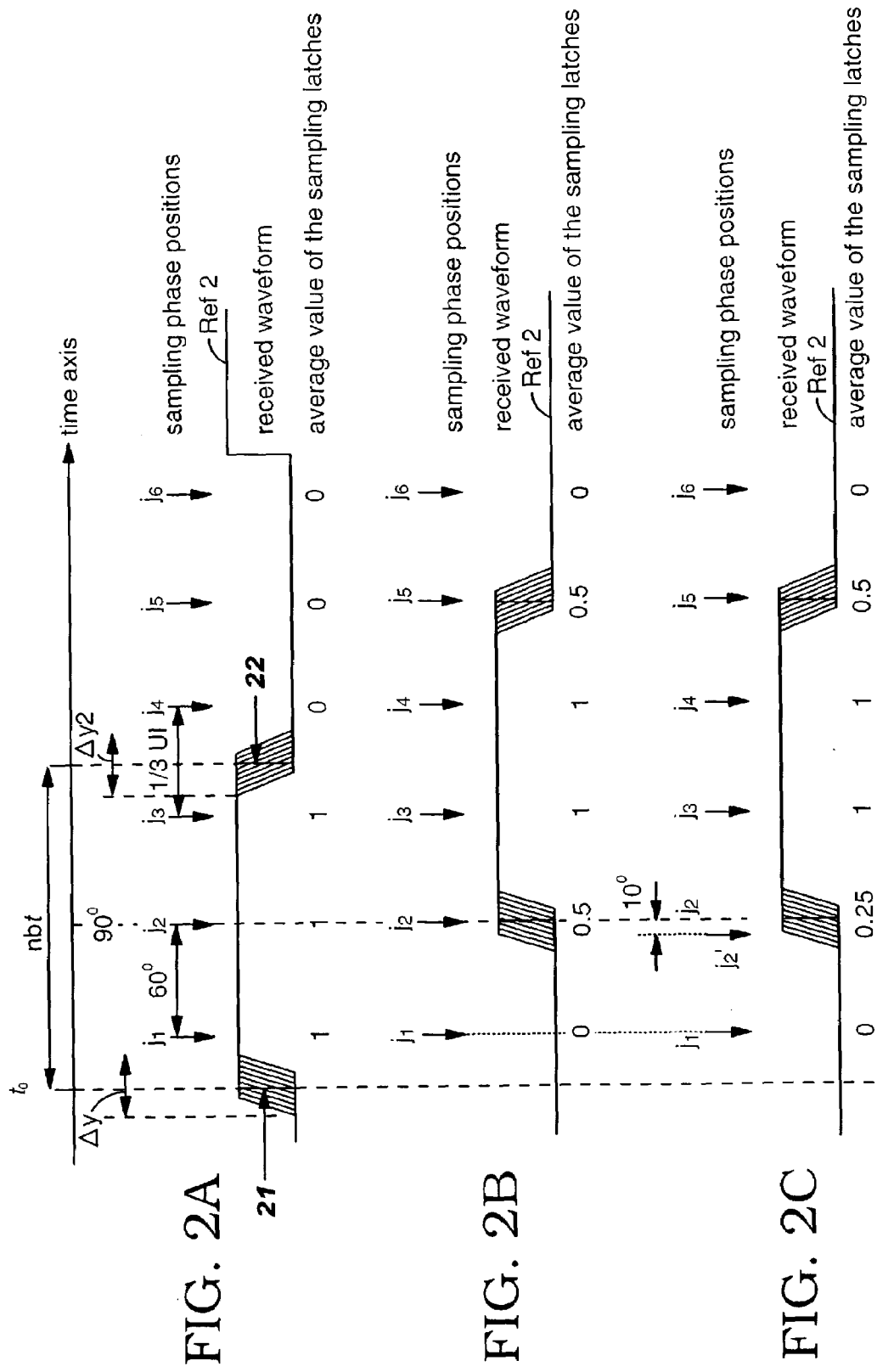
FIG. 2a shows a timing diagram of a reference signal received at the input of a clock and data recovery receiver and the corresponding sampled values with a 0° setting of the phase interpolator.
FIG. 2b shows a timing diagram of the reference signal and the corresponding sampled values with a 90° setting of the phase interpolator.
FIG. 2c shows a timing diagram of the reference signal and the corresponding sampled values with a 90° setting of the phase interpolator and a 10° sampling phase error at the second sampling phase.

In the calibration mode a reference signal Ref2 with constant frequency and constant phase is sampled. The reference signal Ref2 may have the form as illustrated in FIG. 2a. At the time t0, what is equivalent to the phase ($\phi$=0, the reference signal Ref2 changes its level from low to high and stays on this level for a certain period nbt. This period is called nominal bit time nbt. After this period at the phase (φ=180° the reference signal Ref2 returns to low. In practice the rising edge 21 of the reference signal Ref2 does not have a vertical course but increases during a rising period until it has reached its high level. In practice the time when the rising edge 21 appears is also subjected by a certain inaccuracy. The period in which the rising edge 21 appears is indicated in FIG. 2a by the time Δt1. The same analogously also applies to the falling edge 22 of the reference signal Ref2. The period in which the falling edge 22 appears is indicated in FIG. 2a by the time Δt2. The reference signal Ref2 is sampled now with sampling latches at the sampling phases (φ1, φ2, ... φ6. The sample values are determined with the sampling latches SL1 ... SL6, wherein each sampling latch is assigned to a sampling phase (φ1, φ2, ... φ6. Therefore, there are n sampling latches SL1 ... SLn, if there are n sampling phases (φ1, φ2, ... φn. If at the sampling phase φ1 the sample value SV is determined s times with the sampling latch SL1, an average value AV1 (φ1) of these s sampling values SV1 ... SVs can be calculated as indicated below.

$$AV1(\varphi 1) = \frac{SV1(\varphi 1) + SV2(\varphi 1) + \ldots + SVs(\varphi 1)}{s}$$

wherein s=number of sample values SV at a certain sampling phase φ.

Analogous the same calculation can be done at the nth sampling phase φn:

$$AVn(\varphi n) = \frac{SV1(\varphi n) + SV2(\varphi n) + \ldots + SVs(\varphi n)}{s}$$

At the bottom region of FIG. 2a the average values AV1 to AV6 corresponding to the sample phases φ1 to φ6 are shown. For example, the average value AV1 (φ1)=1, while the average value AV4(φ4)=0.

In FIG. 2a to 2c the reference signal Ref2 is sampled in 60° phase steps.

In FIG. 2b the reference signal Ref2 is moved with 90° towards the reference signal Ref2 from FIG. 2a. A sampling with the first sampling latch at the sampling phase (PI leads now to an average value AV1 (φ1)=0. In FIG. 2b the reading from the second latch, which corresponds to the second sampling phase φ2, will on average be as often zero as will be one. This is because the received waveform Ref2 has a zero-crossing right at that time. Therefore the average value AV2(φ2)=0.5. The same analogous applies to the fifth average value AV5(φ5), which is also 0.5.

In FIG. 2c the second sampling latch, which is used for determining the s sample values SV1(φ2) ... SVs(φ2) at the sampling phase φ2 and therefore for the calculation of the average value AV2(φ2) shows a sampling phase error Δφ of 10°. Due to this fact, the reference signal Ref2 is sampled 10° too early. Therefore, sample values SV1(φ2) ... SVs(φ2) are more often zero than one and the average value AV2(φ2) will be decrease to 0,25. It is not zero due to jitter effects.

Figure 3:
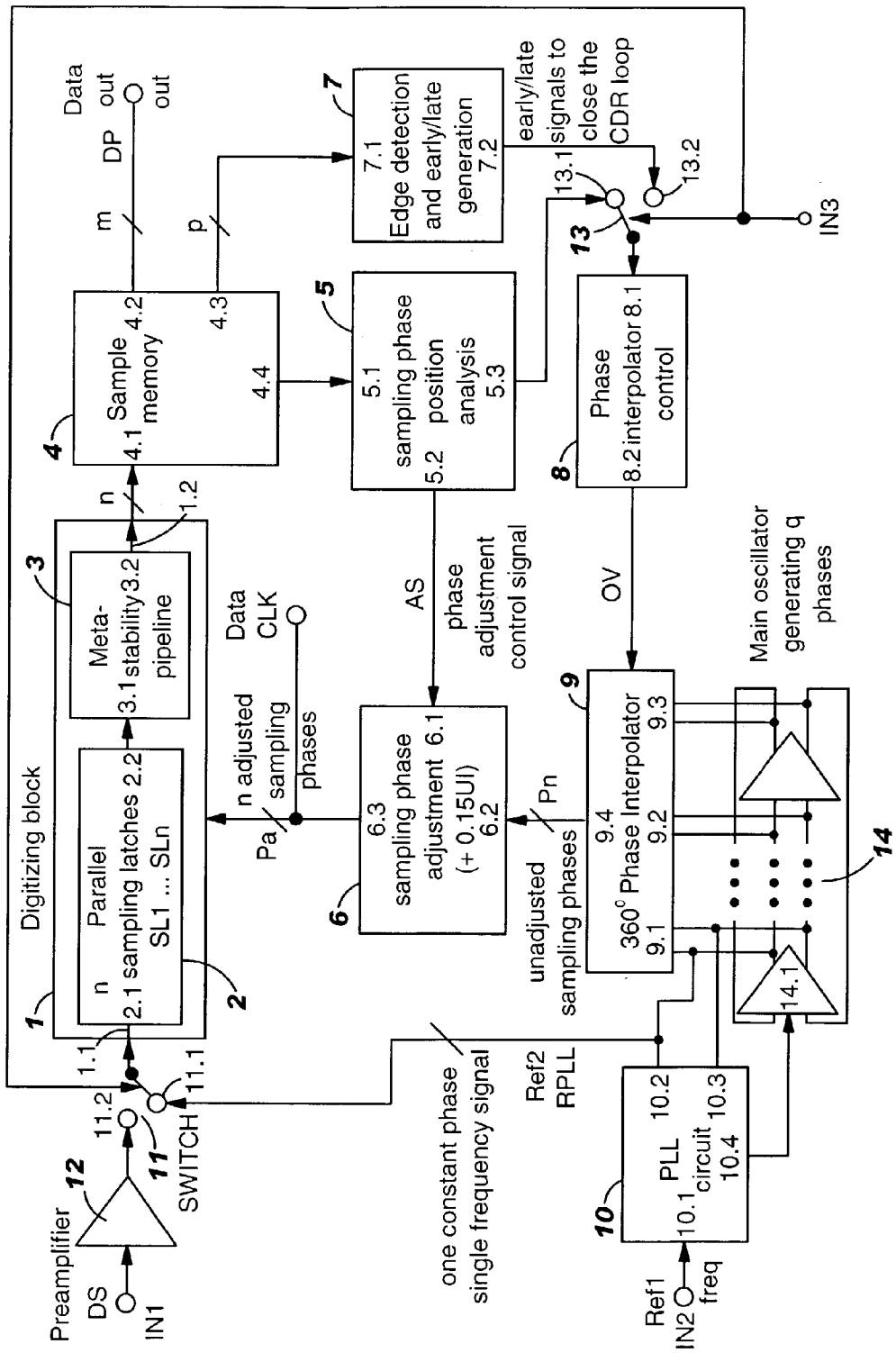
FIG. 3 shows a block diagram of a clock and data recovery receiver according to the invention.

FIG. 3 shows a block diagram of a clock and data recovery receiver according to the invention. The serial data signal DS is put on the input IN1 of the receiver, which is connected to a preamplifier 12 for a preamplification of the serial data signal DS. The output of the preamplifier 12 in turn is connected to a first input terminal 11.2 of a switch 11. A second input terminal 11.1 of the switch 11 is connected to the output 10.2 of a phase locked loop (PLL) 10, which generates a reference signal Ref2 with a frequency fpLL from a reference signal Ref1. The reference frequency fPLL of the reference signal Ref2 is a multiple, e.g. a 16-fold of the frequency of the reference signal Ref1 and has a constant phase and a single frequency. The phase locked loop 10 serves as frequency multiplier for the frequency of the reference signal Ref1 and generates also reference signals for a 360° phase interpolator 9 and a main oscillator 14. For this purpose, the PLL outputs 10.3 and 10.4 are connected to the input 9.1 of the phase interpolator 9 and the input 14.1 of the main oscillator 14. The outputs of the main oscillator 14, which deliver in the embodiment shown in FIG. 3 three phases, are connected to the inputs 9.1, 9.2 and 9.3 of the phase interpolator 9. The main oscillator 14 is not restricted to the generation of three phases. Depending on the requests the main oscillator 14 can also generate more than three phases. The phase interpolator 9 delivers n unadjusted sampling phases φu, in which n is the number of different sampling phases, to the input 6.2 of a sampling phase adjustment unit 6. Depending on a phase adjustment signal AS, which is from a sampling phase position analyzer 5, the sampling phase adjustment unit 6 corrects the n unadjusted sampling phases φu1 ... φun and generates n adjusted sampling phases φa1 ... φan. Examples of how the sampling phase adjustment unit 6 can be realized are illustrated in the FIGS. 4a, 4b and 4c. They will be explained in more detail later on. The sampling phase adjustment unit 6 may have for example a resolution of 0,15 UI (unit intervals). The n adjusted sampling phases φa1 ... φan are led to the n parallel sampling latches 2, which sample the incoming serial data signal DS or reference signal Ref2 and determine the corresponding sample values SV1 ... SVn as already shown in the FIGS. 2a, 2b and 2c. Which one of the two signals DS or Ref2 is sampled is decided by the switch 11. The n sampling latches 2 are followed by a metastability pipeline 3, which serves for generating n stable digital outputs. The metastability pipeline 3 and the sampling latches 2 are combined to a digitizing block 1. The n outputs 3.2 of the metastability pipeline 3 respectively the outputs 1.2 of the digitizing block 1 are connected to a sample memory 4, which stores the sample values SV1(φ1) ... SV1(φn), SV2(φ2) ... SVs(φn). With the sampling phase position analyzer (5), whose inputs 5.1 are connected to the outputs 4.4 of the sample memory 4, the average values AV1 to AVn are calculated and depending from it the phase adjustment control signal AS is adjusted. The second output 5.3 of the sampling phase position analyzer 5 is connected to the first input 13.1 of a switch 13. The second input 13.2 of the switch 13 is connected to an edge detection and early/late generator 7. Over the switch 13 is decided whether the output 7.2 of the generator 7 or the output 5.3 of the sampling phase position analyzer 5 is led to the input 8.1 of a phase interpolator 8. The input 7.1 of the edge detection and early/late generator 7 is connected to the output 4.3 of the sample memory 4. The number p of bits transferred from the sample memory 4 to the generator 7 is typically n plus 2. The first one of the two additional bits represents the sample value which is the one before the first of the n sample values SV(φ1). The second one of the two additional bits represents the sample value which follows the last one of the n sample values SV(φn).

Over an input IN3 the clock and data recovery receiver can be switched from a calibration mode into a recovery mode. In the calibration mode the switch 11 connects the reference signal Ref2 to the inputs 2.1 of the sampling latches 2 and the switch 13 connects the output 5.3 to the input 8.1 of the phase interpolator controller 8. However, in the recovery mode the switch 11 connects the preamplified serial data signal DS to the inputs 2.1 of the sampling latches 2 and the switch 13 connects the output 7.2 of the generator 7 to the input 8.1 of the phase interpolator controller 8.

A possible embodiment of the phase rotator 9 is described in the US patent application "Phase rotator and data recovery receiver incorporating said phase rotator", US2002/0009170A1, which is owned by the patent applicant. Especially in the FIGS. 3, 7, 8 and 9 and the corresponding description of this application such an phase rotator and oscillator is illustrated.

The receiver according to the invention works as follows. At first the receiver is switched in the calibration mode. This can be done for example in the power up phase. In the calibration mode at first the sample phase position is measured. This can be done in the following way.

Measurement of Sample Phase Position

The measurement of the phase timing or sampling phase position is performed by supplying the single frequency reference signal Ref2 over the switch 11 to the inputs 1.1 of the digitizing block 1 and by analyzing the average sampling pattern.

This reference signal Ref2 is sampled several times and for all positions of the phase adjustment device comprising the phase interpolator 9 also called phase rotator and the sampling phase adjustment unit 6 of the receiver. The analysis of the resulting average value pattern obtained after reading the sample latches 2 allows an accurate determination of the phase error $\Delta\phi$, e.g. the sampling phase error for the second latch is $\Delta\phi 2=\phi 2-\phi 2'$ as illustrated in FIG. 2c. The FIGS. 2a, 2b and 2c show the nominal sampling pattern for three-fold oversampling operating at half-rate.

By letting the phase interpolation device 9 go thru all its potential phase positions $\phi 1 \ldots \phi n$, the average values AV1 . . . AVn of the sampling latches SL1 . . . SLn will change according to FIGS. 2a, 2b and 2c. For example, the reading from the second latch in FIG. 2b will on average be as often a 'zero' as will be a 'one'. This is because the received waveform of the reference signal Ref2 has a zero-crossing right at that time.

Under the assumption that a 10° phase error $\Delta\phi 2$ in the second sampling latch occurs, the situation from FIG. 2b will change into the situation shown in FIG. 2c. The sampling phase $\phi 2$ is shifted by 10°, and therefore the average reading from sampling latch 2 is only 0.25. It is not zero due to jitter effects. Any average value AV not equal to 0.5 indicates that the sampling phase position $\phi$ is deviating from its ideal position. This information is used to adaptively shift the sampling phase $\phi$ to its ideal position, meaning to an average reading of AV=0.5. For this purpose the raising and the falling edges of the reference signal Ref2 are used. The sampling phases $\phi 1 \ldots \phi n$ are shifted as often as necessary so that each sampling phase $\phi 1 \ldots \phi n$ can be synchronized with a rising or a falling edge 21, 22 of the reference signal Ref2. In FIG. 2b the sampling phases $\phi 2$ and $\phi 5$ and therefor the sampling latches 2 and 5 can be synchronized with the edges of the reference signal Ref2 by reducing the sampling phase error $\Delta\phi=\phi-\phi'$ so long till the average value AV is 0.5. By shifting the sampling phases $\phi 1 \ldots \phi n$ by 60° to the right, what is not shown in the FIG. 2a to 2c, the sampling phases $\phi 3$ and $\phi 6$ can be fine tuned and therefore be synchronized with the edges of the reference signal Ref2. In other words, if the phase interpolating device 9 has shifted the sampling phases $\phi 1 \ldots \phi 6$ by additional 60°, the same situation as before can be expected now at the sampling latch SL3 and SL6. The calibration can therefore be repeated for the sampling phases $\phi 3$ and $\phi 6$. By shifting the sampling phases $\phi 1 \ldots \phi n$ by 60° to the left, what is also not shown in the FIG. 2a to 2c, the sampling phases $\phi 1$ and $\phi 4$ can also be fine tuned and therefore be synchronized with the edges of the reference signal Ref2. After that all sampling phases $\phi 1 \ldots \phi 6$ and with that all sampling latches SL1 . . . SL6 are synchronized with the reference signal Ref2.

If the phase interpolator 9 is shifting the phases $\phi 1 \ldots \phi n$ to all nominal phase positions, all n sampling positions may be accurately calibrated.

It is noted that the receiver is still in calibration mode. In a second step the correction of phase positions is executed.

Correction of Phase Position

If the phase interpolating device 9 has the capability to control each of the sampling phases $\phi 1 \ldots \phi n$ individually, programming offset values OV in the phase interpolation control 8 is sufficient to correct the position of the sampling phase s$\phi 1 \ldots \phi n$. However, this would require significant amount of on-chip memory to store the phase offset value for each sampling signal for each of its potential settings.

A more efficient way of implementing the phase adjustment is to add a programmable phase delay element 6 also called sampling phase adjustment unit after the phase interpolator 9 as shown in FIG. 3. Due to the fact that this phase delay element 6 has only to correct the residual errors $\Delta\phi$, the dynamic range may be small and will probably be in the order of ±0.15 UI.

Figure 4C:
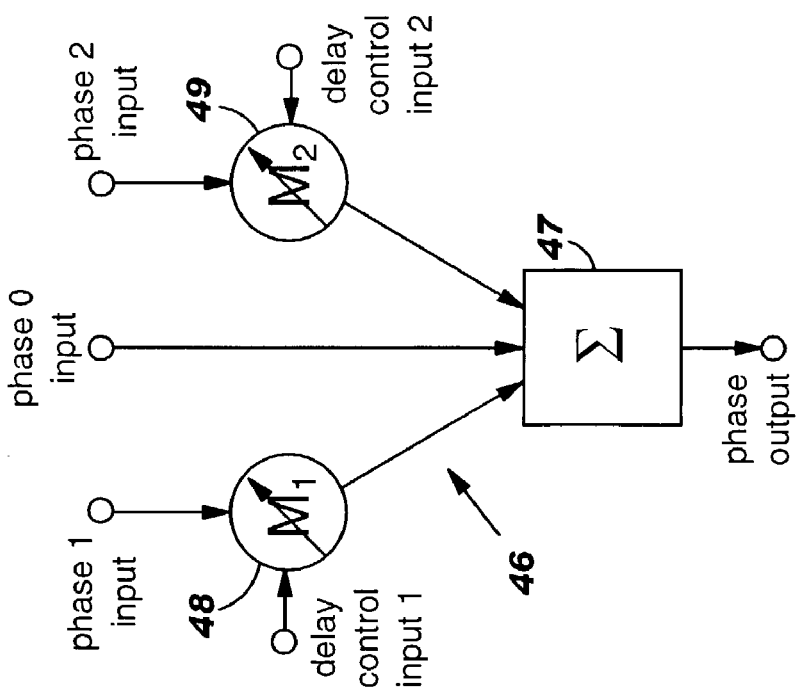
FIG. 4c shows a third embodiment of a phase adjusting unit which is a part of the clock and data recovery receiver shown in FIG. 3.

Various methods exist to adjust the phase of a sampling signal over a small range. In a first embodiment buffers 41 with programmable delay times as illustrated in FIG. 4a can be implemented in the sampling phase adjustment unit 6. The programming can affect the drive current or can add variable amount of capacitive loading to the output of the driver.

Figure 4B:
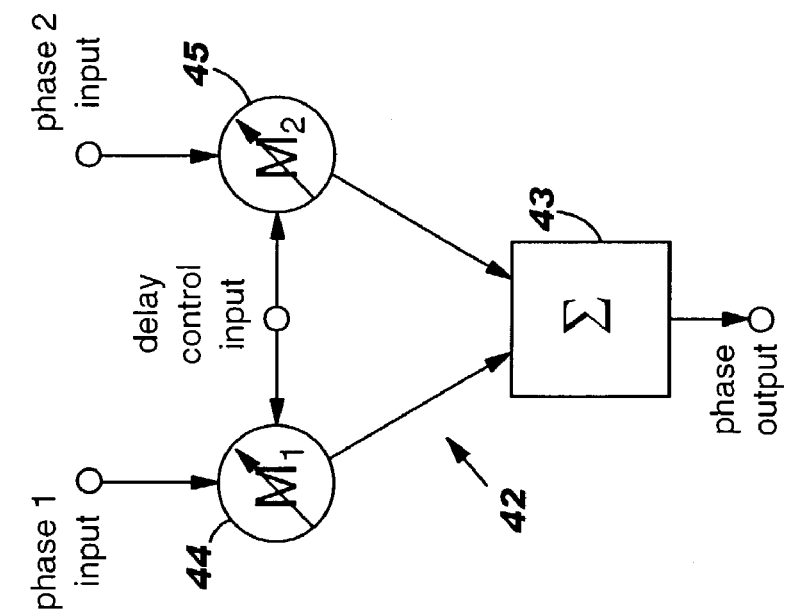
FIG. 4b shows a second embodiment of a phase adjusting unit which is a part of the clock and data recovery receiver shown in FIG. 3.
Figure 4A:
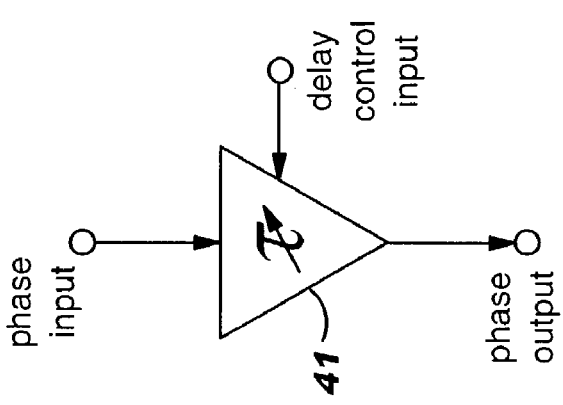
FIG. 4a shows a first embodiment of a phase adjusting unit which is a part of the clock and data recovery receiver shown in FIG. 3.

In a more preferred embodiment, which is shown in FIG. 4b, a phase interpolating device 42 that gets its inputs from two consecutive phases can be implemented in the sampling phase adjustment unit 6. This allows to interpolate from one phase to the other. The signals received at the two phase inputs can also be weighted by weighting units 44 and 45. Afterwards, the weighted signals are added by an adder 43.

In a third embodiment, a phase interpolating device 46 as shown in FIG. 4c can be implemented in the sampling phase adjustment unit 6. The phase interpolating device 46 can be realized in a form where the nominal sampling signal is superimposed by programmable levels of signal energy from on of its neighbors. The reference signs 48 and 49 indicate again two weighting units. The weighted signals and the nominal sampling signal are added with the help of an adder 47.

Preferably, this phase interpolation is integrated into the output stage of the 360° phase interpolating device 9.

After determination of the correction of the phase position the calibration mode is left and the receiver is switched in the recovery mode. The receiver works now with high accuracy concerning the clock and data recovery and with a very low bit error rate.

Figure 5:
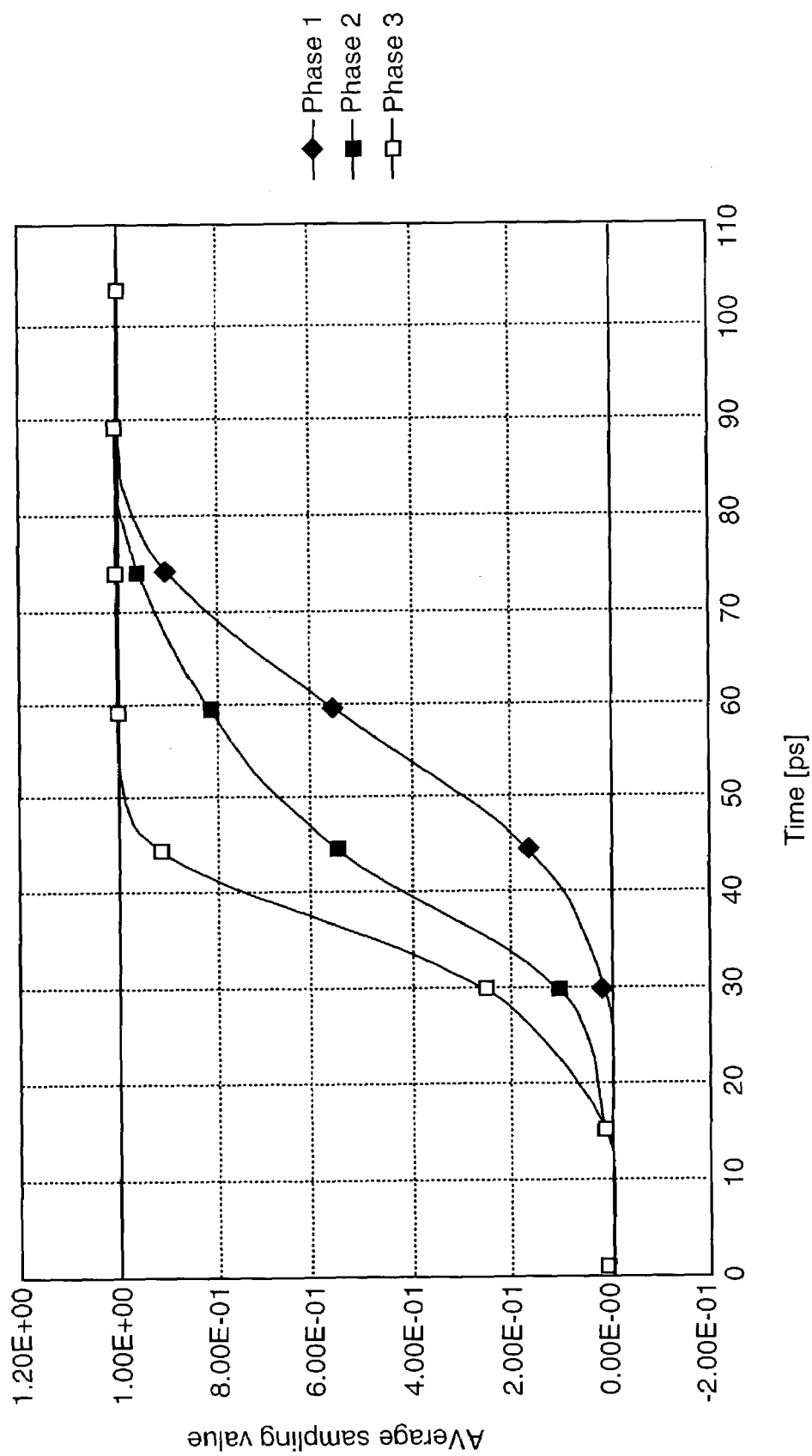
FIG. 5 shows a first timing diagram which is the result of a phase accuracy analysis for three sampling latches.

The FIG. 5 shows the result of a phase accuracy typical analysis. Each of the three sampling latches was read 512 times at a stable manual phase setting of the phase rotator 9. After that, the phase rotator 9 was manually moved by one phase step (1 UI/27) and each latch was read again 512 times. This read-step-read procedure was repeated over 1024 UI cycles (=512 times 54 phase steps). This corresponds to a total of 14 million measurements. The large amount of data allows good average factors in the post-mortem analysis to reduce timing noise, but in fact far less data would do the job as well.

In the FIG. 5, each phase reading was averaged over the 512 double bit cycles and three consecutive phases were timewise adjusted to have the same nominal transition time. As might be seen, the maximum phase difference is approximately 25 ps.

Figure 6:
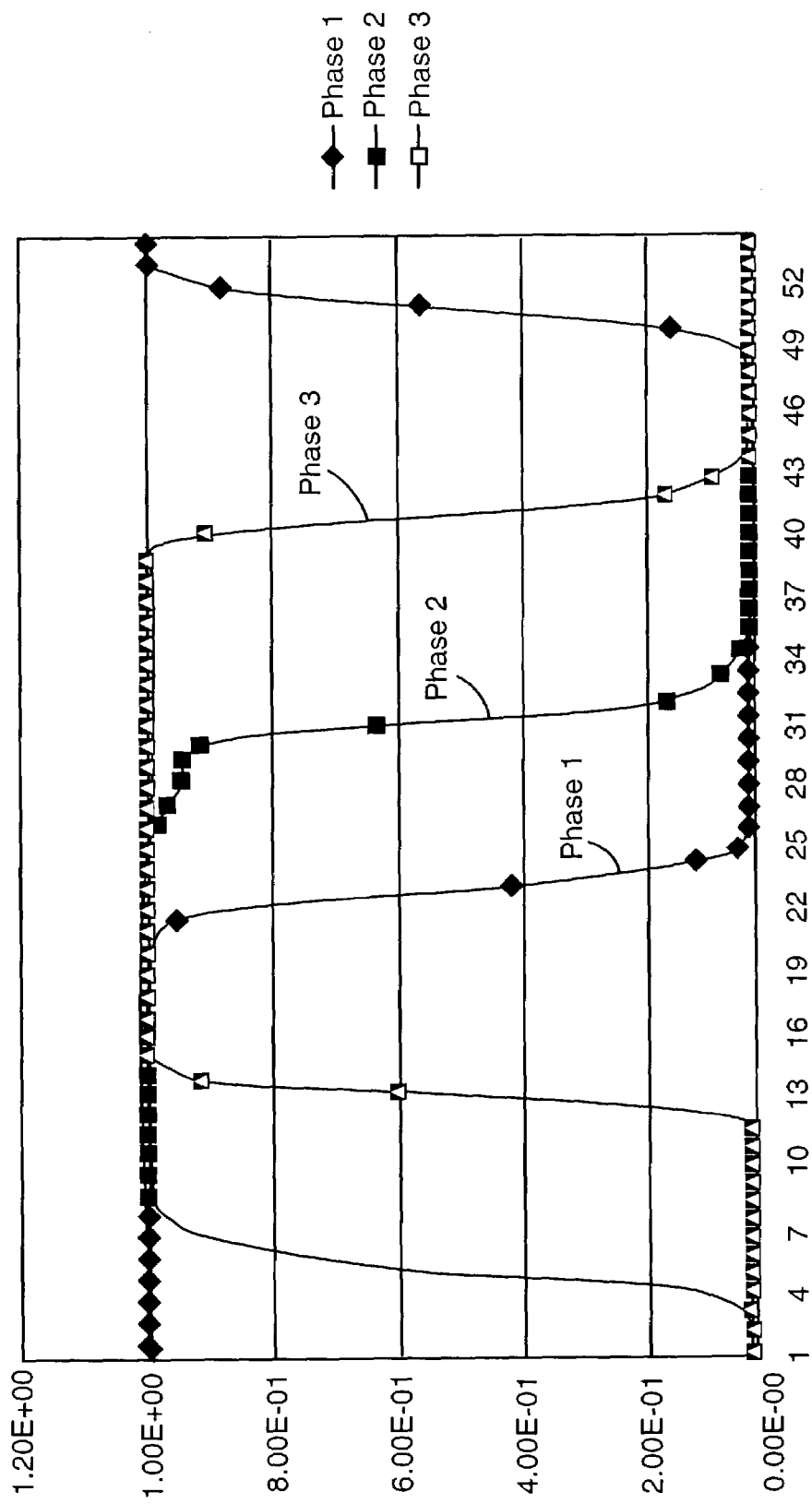
FIG. 6 shows a second timing diagram which is the result of a phase accuracy analysis for three sampling latches.
Figures 7, 8:
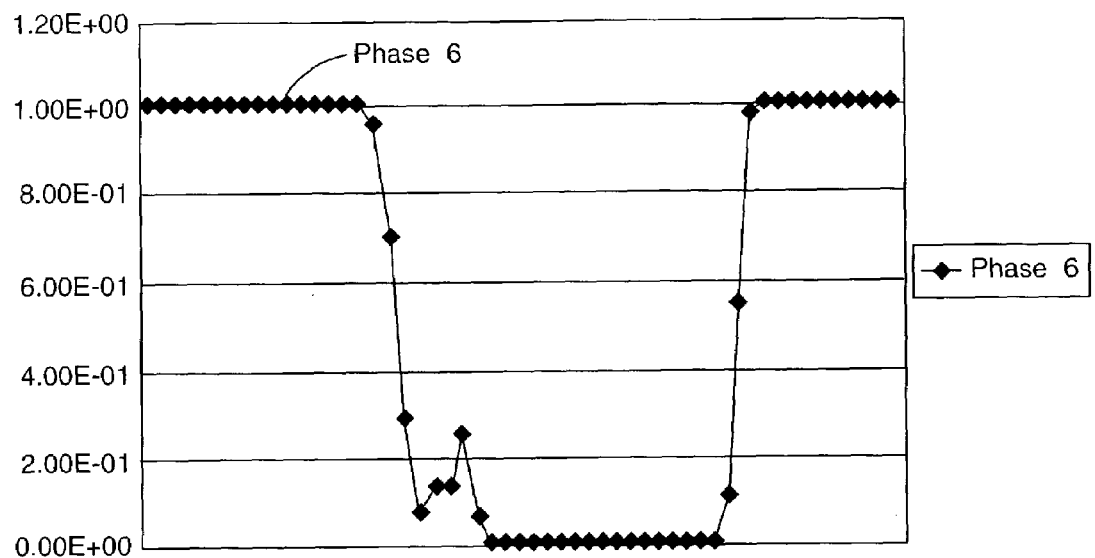
FIG. 7 shows a first timing diagram of a sampled signal with an inaccurate working sampling latch.
FIG. 8 shows a second timing diagram of a sampled signal with a further inaccurate working sampling latch.

FIGS. 6, 7 and 8 demonstrate that this analysis method is a very powerful tool to analyze internal effects.

The FIG. 6 shows the three phases from FIG. 5 over one half-rate rotation (54 phase rotator steps). A comparison of the sampling latches SL1 and SL3 with the sampling latch SL2 shows that the second latch SL2 has problems with the falling edge of the input as might be seen from the early drop. Please note that the y-axis is showing averaged values with the implication that the falling edge jitter of phase 2 is significantly larger than it should be.

This is also a valid method to check if the sampling latch and its metastability pipeline are actually working. It would allow at-speed BIST. The FIG. 7 shows a latch SL6 that has problems with the falling edge. FIG. 8 gives the measurement result from a latch SL5 that is obviously dead, what is not very helpful for good BER performance.

Reference Signs

Below are signs used in this document.

| | |
|---|---|
| M | multiplexer |
| C | data channel |
| D | demultiplexer |
| R | clock and data recovery unit |
| 1 | digitizing block |
| 2 | sampling latches |
| 3 | metastability pipeline |
| 4 | sample memory |
| 5 | sampling phase position analyzer |
| 6 | sampling phase adjustment unit |
| 7 | edge detector and early/late generator |
| 8 | phase interpolator controller |
| 9 | phase interpolator |
| 10 | PLL |
| 11 | switch |
| 12 | preamplifier |
| 13 | switch |
| 14 | main oscillator |
| IN1 | receiver input |
| IN2 | PLL input |
| IN3 | control input |
| OUT | receiver output |
| φu | unadjusted sampling phase |
| φa | adjusted sampling phase |
| φ1 | first sampling phase |
| φ2 | second sampling phase |
| φ2' | second sampling phase with phase error |
| DS | serial data signal |
| DP | parallel output data |
| AS | phase adjustment control signal |
| Ref1 | first reference signal |
| Ref2 | second reference signal |
| fPLL | PLL output frequency |
| n | number of sampling latches |
| m | bit width of parallel output data |
| p | number of bits |
| s | number of sampling values at one sample phase |
| SV | sample value |
| AV | average value |
| Δt1, Δt2 | periods |
| 21 | rising edge |
| 22 | falling edge |
| nbt | nominal bit time |
| 41 | buffer |
| 42 | phase interpolator |
| 43 | adder |
| 44 | first weighting unit |
| 45 | second weighting unit |
| 46 | phase interpolator |
| 47 | adder |
| 48 | first weighting unit |
| 49 | second weighting unit |

Having illustrated and described a preferred embodiment for a novel data processing device and a method for data transfer, it is noted that variations and modifications in the device and the method can be made without departing from the spirit of the invention or the scope of the appended claims.

The invention claimed is:

1. A receiver for clock and data recovery, comprising
   n sampling latches (SL1 . . . SLn) for determining n sample values (SV1 . . . SVn) of a reference signal (Ref2) at n sampling phases (j1a . . . jna), having sampling latch inputs and sampling latch outputs,
   a phase position analyzer (5) connected to said sampling latch outputs for generating an adjusting signal (AS) for adjusting the sampling phase (j1a . . . jna), if the sample value (SV1 . . . SVn) deviates from a set point,
   a phase interpolator (9) for generating sampling phases (j1u . . . jnu),
   a sampling phase adjusting unit (6) connected with its inputs to the phase position analyzer (5) and the phase interpolator (9) and with its outputs to the sampling latches (SL1 . . . SLn) for generating adjusted sampling phases (j1a . . . jna) depending on said sampling phases (j1u . . . jnu) and said adjusting signal (AS),
   a sample memory (4) for storing the sampled values (SV1 . . . SVn) and connected between the sample latches (SL1 . . . SLn) and the phase position analyzer (5),
   a data output (OUT) for delivering parallel data (DP) and connected to the sample memory (4), and
   an edge detection unit (8) for detecting edges in a serial data signal (DS) and connected between the sample memory (4) and a control input of the phase interpolator (9).

2. Receiver according to claim 1,
   wherein the phase position analyzer (5) comprises means for determining average values (AV1 . . . AVn) of the sample values (SV1 . . . SVn).

3. Receiver according to claims 1 or 2,
   comprising a data input (IN1) for receiving said serial data (DS), which shall be recovered, and comprising switching means (11) connected to the sampling latch inputs, wherein said switching means (11) are provided for leading said serial data (DS) or the reference signal (Ref2) to the said sampling latch inputs.

4. Receiver according to claims 1 or 2,
   wherein the reference signal (Ref2) has a constant phase and a constant frequency.

5. Receiver according to claim 2,
   wherein the phase position analyzer (5) comprises means for increasing the adjusting signal (AS), if the average value (AV1, . . . AVn) is lower than a set point, and for decreasing the adjusting signal (AS), if the average value (AV1, . . . AVn) is higher than said set point.

6. Receiver according to claim 1,
wherein the sampling phase adjusting unit (6) comprises a buffer (41) or inverter with a programmable delay time.

7. Receiver according to claim 1,
wherein the sampling phase adjusting unit (6) comprises a phase interpolating device (42) for interpolating two consecutive sample phases.

8. Receiver according to claim 7,
wherein the interpolating device comprises first and second means (44, 45) for weighting the two sample phases.

9. Receiver according to claim 1,
wherein the sampling phase adjusting unit (6) comprises a phase interpolating device (46) for interpolating three sample phases, wherein one of these is a nominal sampling phase superimposed by the two other phases.

10. Method for calibrating sampling phases in a receiver for clock and data recovery, comprising the following steps of:
- a reference signal (Ref2) is led to n sampling latches (SL1 . . . SLn),
- the reference signal (Ref2) is sampled at different sampling phases (j1u . . . jnu) and the corresponding sample values (SV1 . . . SVn) are determined with said sampling latches (SL1 . . . SLn),
- the sampled values are stored within a sample memory (4) connected between the sample latches (SL1 . . . SLn) and a phase position analyzer (5),
- parallel data (DP) is delivered from a data output (OUT) connected to the sample memory (4),
- edges in a serial data signal (DS) are detected by an edge detection unit (8) connected between the sample memory (4) and a control input of a phase interpolator (9), and
- if said sample value (SV1 . . . SVn) deviates from a set point, the corresponding sampling phase (j1u . . . jnu) is corrected.

11. Method according to claim 10,
wherein the reference signal (Ref2) is led to the sampling latches (SL1 . . . SLn) and the receiver is switched to calibration mode, the receiver capable of switching at least between the calibration mode and a recovery mode.

12. Method according to claim 11,
wherein after calibration in the calibration mode is finished said receiver is switched to the recovery mode.

13. Method according to any of the claims 10 or 11,
wherein the determination of the sample values (SV1 . . . SVn) comprises the following steps:
a) the reference signal (Ref2) is sampled s times at a first sample phase position (j1u), wherein the sample value (SV1) of the reference signal (Ref2) is determined each time with the first sample latch (SL1),
b) from the s sample values (SV1) an average value (AV1) is calculated,
c) these steps are repeated at n sampling phases (j2. . .jn), wherein at the nth sampling phase (jn) each sample value (SVn) is determined with the nth sample latch (SLn).

14. Method according to claim 10,
wherein the correction of the sampling phase (j1u, . . . jnu) comprises the following step: the sampling phase (j1u, . . . jnu) is increased if the average value (AV1, . . . AVn) is lower than 0.5.

15. Method according to claim 10,
wherein the correction of the sampling phase (j1u, . . . jnu) comprises the following step: the sampling phase (j1u, . . . jnu) is decreased if the average value (AV1, . . . AVn) is higher than 0.5.

16. Method according to claim 10,
further comprising the following steps:
- the sampling phases (j1u, . . . jnu) are shifted by a predetermined value,
- the reference signal (Ref2) is sampled at said shifted sampling phases (j1u . . . jnu) and the corresponding sample values (SV1 . . . SVn) are determined with said sampling latches (SL1 . . . SLn),
- if said sample value (SV1 . . . SVn) deviates from the set point, the corresponding sampling phase (j1u . . . jnu) is corrected, and
- these steps are repeated as often as it is necessary for synchronizing all sampling phases (j1u . . . jnu) with the reference signal (Ref2).

* * * * *